(12) United States Patent
Simons et al.

(10) Patent No.: US 8,476,979 B1
(45) Date of Patent: Jul. 2, 2013

(54) HIGH-EFFICIENCY POWER MODULE

(75) Inventors: Rainee N Simons, North Olmsted, OH (US); Edwin G Wintucky, Willoughby, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 13/178,101

(22) Filed: Jul. 7, 2011

(51) Int. Cl.
*H02H 7/20* (2006.01)

(52) U.S. Cl.
USPC ........................................ 330/298; 330/207 P

(58) Field of Classification Search
USPC ................................ 330/298, 207 P, 296, 285
See application file for complete search history.

(56) References Cited

U.S. PATENT DOCUMENTS

| | | | | |
|---|---|---|---|---|
| 4,792,987 A * | 12/1988 | Tumeo | | 455/131 |
| 6,617,927 B2 * | 9/2003 | Numanami et al. | | 330/277 |
| 7,123,094 B2 * | 10/2006 | Tahara et al. | | 330/285 |
| 7,193,471 B2 * | 3/2007 | Tsutsui et al. | | 330/285 |
| 7,215,203 B2 * | 5/2007 | Matsunaga et al. | | 330/285 |
| 7,271,662 B2 * | 9/2007 | Akamine et al. | | 330/310 |
| 7,560,992 B2 * | 7/2009 | Vejzovic | | 330/296 |
| 8,183,925 B2 * | 5/2012 | Ohta et al. | | 330/285 |

* cited by examiner

*Primary Examiner* — Henry Choe
(74) *Attorney, Agent, or Firm* — Ronald H. Earp, III

(57) ABSTRACT

One or more embodiments of the present invention pertain to an all solid-state microwave power module. The module includes a plurality of solid-state amplifiers configured to amplify a signal using a low power stage, a medium power stage, and a high power stage. The module also includes a power conditioner configured to activate a voltage sequencer (e.g., bias controller) when power is received from a power source. The voltage sequencer is configured to sequentially apply voltage to a gate of each amplifier and sequentially apply voltage to a drain of each amplifier.

18 Claims, 8 Drawing Sheets

HIGH-EFFICIENCY POWER MODULE

ORIGIN OF THE INVENTION

The invention described herein was made by an employee of the United States Government and may be manufactured and used by or for the Government for Government purposes without the payment of any royalties thereon or therefore.

FIELD

The present invention relates to a power module and, more particularly, to a high-efficiency all-solid-state microwave power module (SSMPM), that in some embodiments can be used for a multifunction spacecraft payload and can serve as a radar system, a communication system, and/or a navigation system.

BACKGROUND

Historically, the term microwave power module (MPM) is associated with a small fully integrated self-contained radio frequency (RF) amplifier that combines both solid-state and microwave vacuum electronics technologies. Typically, the output power of these MPMs is on the order of about 100 watts CW over an octave bandwidth. Because of their smaller size and lower mass compared to conventional traveling-wave tube amplifiers, these MPMs may have applications in electronic warfare systems.

The MPMs require both a solid-state amplifier at the front end and a microwave vacuum electronics amplifier at the back end. However, such MPMs cannot be utilized for communications because the MPMs are not optimized for linearity or efficiency. Also, the MPMs can be very expensive to manufacture, particularly when modules are produced in very small quantities for space applications. Also, a kilovolt (kV) class power supply is required to power the traveling wave tube amplifier, which is a part of the microwave vacuum electronics.

SUMMARY

Certain embodiments of the present invention may provide solutions to the problems and needs in the art that have not yet been fully identified, appreciated, or solved by current power modules.

In accordance with an embodiment of the present invention, an apparatus is provided. The apparatus includes a plurality of solid-state amplifiers configured to amplify a signal during a low power stage, a medium power stage, and a high power stage. The module also includes a power conditioner configured to activate a voltage sequencer when power is received from a power source. The voltage sequencer is configured to sequentially apply voltage to a gate of each amplifier and sequentially apply voltage to a drain of each amplifier.

In accordance with another embodiment of the present invention, an apparatus is provided. The apparatus includes a low power and/or a low noise amplifier, medium power amplifier, and a high power amplifier. The low power and/or a low noise amplifier is configured to receive a signal from a radio frequency input and amplify the received signal into a second signal. The medium power amplifier is operatively connected to the low power amplifier and is configured to receive the second signal and amplify the second signal into a third signal. The high power amplifier is operatively connected to the medium power amplifier and is configured to receive the third signal and amplify the third signal to a level sufficient to perform navigation, radar, and communication functions. The apparatus includes a power conditioner configured to receive power from a power source and activate a voltage sequencer.

In accordance with yet another embodiment of the present invention, an apparatus is provided. The apparatus includes a plurality of low power and/or low noise amplifiers, a medium power amplifier, and a high power amplifier. Each low power and/or low noise amplifier is configured to receive a signal from a radio frequency input and amplify the received signal into a first amplified signal. The medium power amplifier is configured to receive the first amplified signal and amplify the first amplified signal into a second amplified signal. The high power amplifier is configured to receive the second amplified signal and amplify the second amplified signal into a third amplified signal. The apparatus also includes a power conditioner configured to receive power from a direct current (DC) input. The power conditioner is configured to cause a voltage sequencer to provide a negative voltage to a gate of each preamplifier, the medium power amplifier and the high power amplifier before providing a positive voltage to a drain of each preamplifier, the medium power amplifier and the high power amplifier.

BRIEF DESCRIPTION OF THE DRAWINGS

For a proper understanding of the invention, reference should be made to the accompanying figures. These figures depict only some embodiments of the invention and are not limiting of the scope of the invention. Regarding the figures.

DETAILED DESCRIPTION OF THE EMBODIMENTS

It will be readily understood that the components of the present invention, as generally described and illustrated in the figures herein, may be arranged and designed in a wide variety of different configurations. Thus, the following detailed description of the embodiments of an apparatus, a system, a method, and a computer readable medium, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with the embodiment may be included in at least one embodiment of the present invention. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more embodiments.

Embodiments of the present invention provide a SSMPM for a multifunction spacecraft payload. The SSMPM is based on a multi-stage amplifier design. For instance, the low-power and/or low noise stage can be a high efficiency gallium arsenide pseudomorphic high electron mobility transistor (GaAs pHEMT) based monolithic microwave integrated circuit (MMIC) distributed amplifier. The medium-power stage can be either a high-efficiency GaAs pHEMT or a gallium nitride high electron mobility transistor (GaN HEMT) based MMIC distributed amplifier. The high-power stage can be a GaN HEMT based MMIC distributed amplifier. It should be noted that GaN can be a wide bandgap semiconductor that has excellent thermal properties and is radiation hard. The gate and drain voltages and currents for the amplifier stages can be provided by an electronic power conditioner (EPC) housed within the module.

In addition, the module can also include a direct current (DC) power management circuit, a DC blanking control, a RF output power monitor, and a temperature sensor. To enhance thermal reliability, the module is conduction cooled and designed to operate in pulsed mode for radar and navigation, as well as continuous wave (CW) mode for communications.

Figure 1:
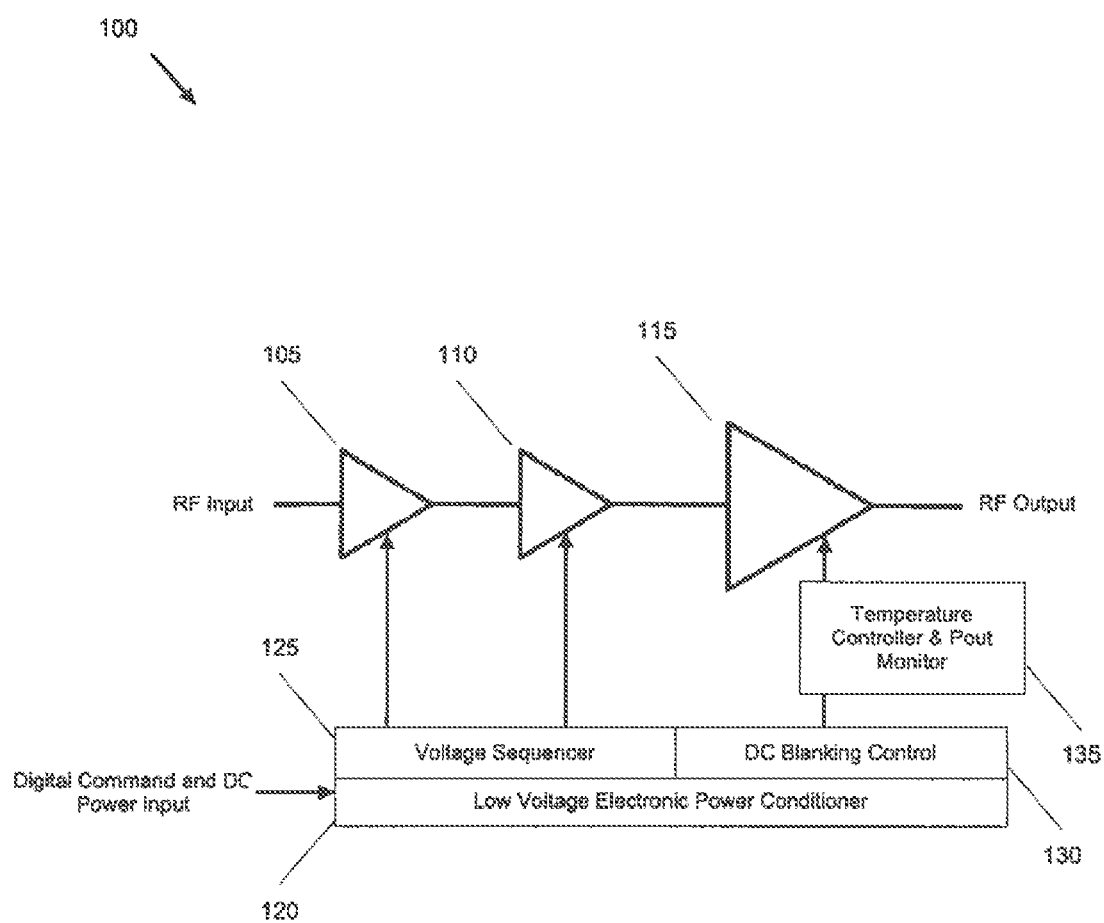
FIG. 1 illustrates a solid-state microwave power module (SSMPM) with cascaded monolithic microwave integrated circuit (MMIC) distributed amplifier stages, in accordance with an embodiment of the present invention.

FIG. 1 illustrates a solid-state microwave power module (SSMPM) 100 with cascaded monolithic microwave integrated circuit (MMIC) distributed amplifier stages, in accordance with an embodiment of the present invention. Module 100 includes a plurality of distributed amplifiers. For instance, module 100 includes a preamplifier (or low-power amplifier) 105, a driver (or a medium-power) amplifier 110, and a power (or high-power) amplifier 115. In this embodiment, low-power amplifier 105 can be a wideband GaAs pHEMT distributed low-power amplifier for preamplification, medium-power amplifier 110 can be a wideband GaN HEMT or GaAs pHEMT distributed medium-power amplifier, and high-power amplifier 115 can be a wideband GaN distributed high-power amplifier.

Also, in this embodiment, low-power amplifier 105 can have a power input of 7.5 to 15 dBm (decibels referenced to one milliwatt) and a power output of 20 to 26 dBm. Preamplifier 105 can receive an RF input at S-band, X-band, or Ka-band. However, it should be appreciated that the RF input can be at any band that would be appreciated by a person of ordinary skill in the art.

For instance, medium-power amplifier 110 can have a power input of 20 to 26 dBm and a power output of 29 to 35 dBm, and a high-power amplifier 115 can have a power input of 29 to 35 dBm and a power output of 37 to 40.5 dBm. The frequency can range from 2 or lower to 40 gigahertz (GHz) or higher. In this embodiment, in order for low-power amplifier 105 to drive medium-power amplifier 110, the power out of low-power amplifier 105 should be in the range of 20 to 26 dBm. Likewise, for medium-power amplifier 110 to drive high-power amplifier 115, the power out of medium-power amplifier 110 should be in the range of 29 to 35 dBm.

Module 100 also includes a low voltage EPC 120. EPC 120 receives power from a power unit (not shown) via a DC input and is configured to provide the gate and drain voltages and currents to low-power amplifier 105, medium-power amplifier 110, and high-power amplifier 115. EPC 120 can also receive a digital command from a central processing unit (CPU) in order to activate the control circuit of the power amplifiers. It should be appreciated that the digital command and power can be received by a single input connection in EPC 120 or by at least two input connections in EPC 120. In other words, EPC 120 is a DC-to-DC power converter configured to transform the spacecraft bus voltage into appropriate voltages as required by the different amplifiers.

Module 100 further includes a voltage sequencer (or power management circuit) 125 and a DC blanking control 130. However, it should be appreciated that voltage sequencer 125 and DC blanking control 130 can be combined into a single unit instead of two separate units.

It should be noted that each amplifier has a gate terminal, a drain terminal, and a source terminal being tied to ground. The gate terminal receives a negative voltage with respect to the source terminal, and the drain terminal receives a positive voltage with respect to the source terminal. This allows the negative and positive voltages to be measure against the source terminal. In order to prevent the amplifiers from malfunction, voltage sequencer 125 is utilized to ensure that the negative voltage is applied to the gate terminal before the positive voltage is applied to the drain terminal of each amplifier. For instance, voltage sequencer 125 first applies the negative voltage to the gate to minimize the current being drawn and then reduces the negative voltage to a desired value of the drain current. In other words, voltage sequencer 125 is configured to manage the correct power-up and power-down sequence in order to ensure that the negative gate voltage is applied before the amplifiers are turned on. A person of ordinary skill in the art will readily appreciate that the voltages being applied to the gate terminal and the drain terminal may be in any order and/or a positive voltage may be applied to the gate terminal and the drain terminal based upon the configuration of the module.

DC blanking control 130 is configured to quickly turn off the power supply to high-power amplifier 115 if and/or when a fault condition, such as a broken antenna or a problem in the load, arises. However, it should be appreciated that DC blanking control 130 can be configured to turn off power supply to low-power amplifier 105, medium-power amplifier 110, and/or high-power amplifier 115 when the fault condition arises.

Module 100 also includes a RF output monitor 135 that may be located near or on the high-power GaN die. In this embodiment, RF output monitor 135 includes a temperature controller and a power out monitor. The temperature controller is configured to monitor an over temperature condition and instructs DC blanking control 130 to deactivate high-power amplifier 115 in order to allow high-power amplifier 115 to cool. Once high-power amplifier 115 is at a sufficiently cool temperature for operation, the temperature controller instructs DC blanking control 130 to activate high-power amplifier 115. A person of ordinary skill in the art would readily appreciate that the temperature controller can be configured to monitor low-power amplifier 105 and medium-power amplifier 110, and also instruct DC blanking control 130 to deactivate and activate the amplifiers accordingly.

The power out monitor is configured to monitor the RF output power level and instruct voltage sequencer 125 to adjust voltages being applied to the amplifiers to keep the power output constant. The power out monitor can also monitor for fault conditions, such as any reflection in signals, and, if such a fault condition arises, the power out monitor can alert DC blanking control 130 to deactivate high-power amplifier 115. Once the fault condition is resolved, the power out monitor can instruct DC blanking control 130 to activate high-power amplifier 115. In other embodiments, it should be appreciated that the power out monitor can instruct DC blanking control 130 to deactivate all of the amplifiers when the fault condition arises, as well as instruct DC blanking control 130 to activate the amplifiers when the fault condition is resolved.

The mode of operation involves amplifying an incoming signal from the RF input in the pre-amplifying stage (e.g., at low-power amplifier 105) and boosting the power to a level sufficient to drive medium-power amplifier 110 across its dynamic range. Likewise, the output of medium-power amplifier 110 is configured to drive high-power amplifier 115 across its dynamic range. The dynamic range can be the difference between a 1 dB compression point (P1 dB) and the minimum detectable output power (Pout (min)). While various ranges and bandwidths are discussed herein, these may vary according to design choice, as would be appreciated by a person of ordinary skill in the art.

Figure 2:
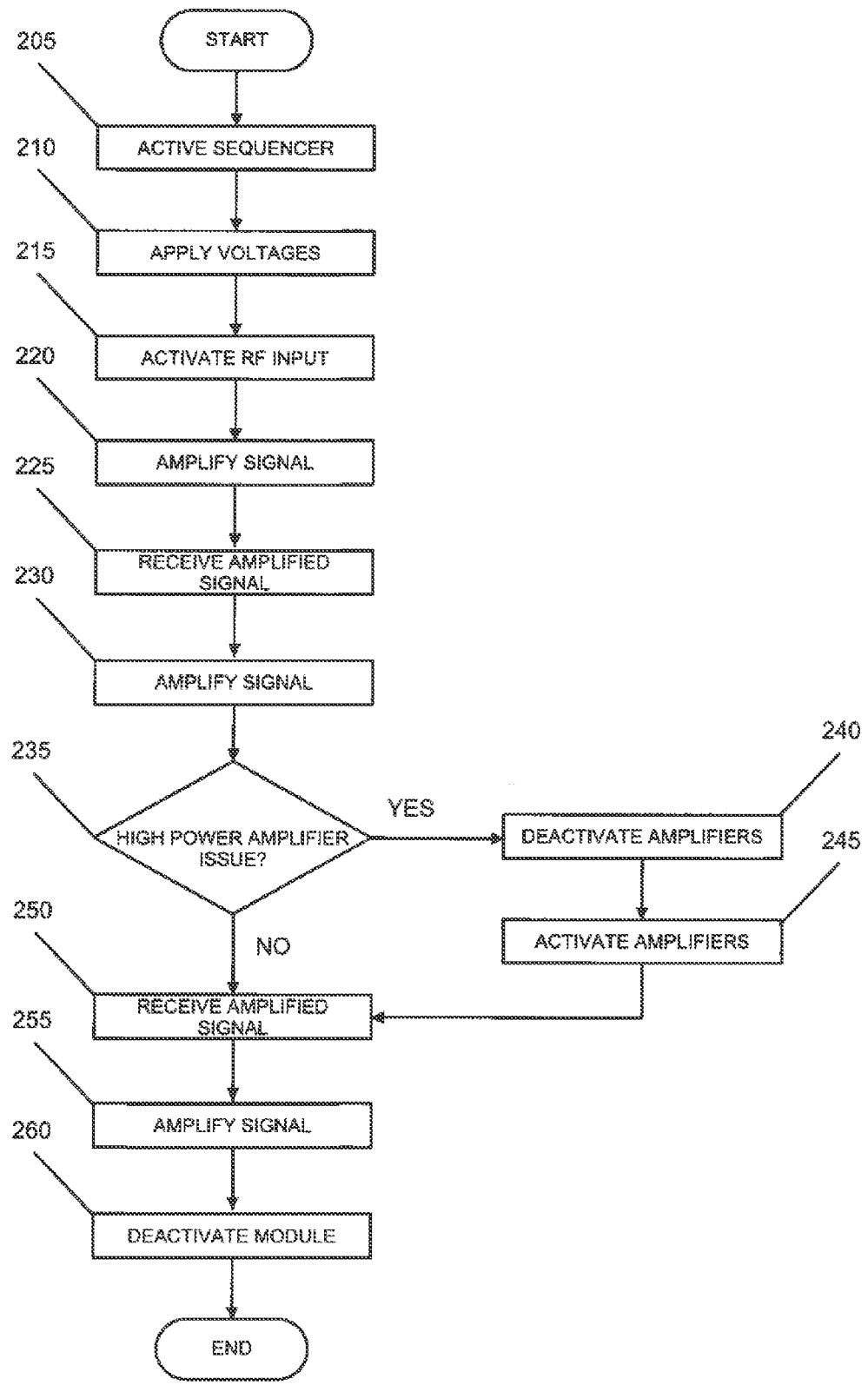
FIG. 2 illustrates a method for powering the amplifiers when the spacecraft performs radar, communication and/or navigation functions, in accordance with an embodiment of the present invention.

FIG. 2 illustrates a method 200 for powering the amplifiers when the spacecraft performs radar, communication and/or navigation functions, in accordance with an embodiment of the present invention. At 205, when the EPC receives a command from a central processing unit and determines that DC power is being received from a power source, the EPC activates the voltage sequencer and the DC blanking control. At 210, the voltage sequencer sequentially applies the negative gate voltages and then the positive drain voltages to the low-power amplifier, the medium-power amplifier, and the high-power amplifier. It should be noted that in order for the voltage sequencer to apply the voltages to the amplifiers, the EPC commands the voltage sequencer to apply voltages to the amplifiers. A person of ordinary skill in the art will readily appreciate that the negative and positive voltages can also be applied to the amplifiers simultaneously.

At 215, a central processing unit (or processor) is configured to activate the RF input so the low-power amplifier can receive a RF signal. Because the RF signal has a small amplitude, the low-power amplifier amplifies at 220 the small amplitude signal to a level that is sufficient to drive the medium-power amplifier. For example, if the low-power amplifier has a gain of 15 dB, the low-power amplifier can amplify the incoming RF signal by approximately 15 dB. As a result, the output power of the low-power amplifier is sufficient to drive the medium-power amplifier.

At 225, the medium-power amplifier receives the amplified signal and, at 230, amplifies the signal to a level that is sufficient to drive the high-power amplifier. For instance, if the medium-power amplifier has a gain of approximately 10 dB, the medium amplifier can receive a very weak RF signal and amplify the signal by 10 dB in order to drive the high-power amplifier.

At 235, the temperature controller and power out monitor determine whether the high-power amplifier has any issues, such as over-heat and/or a fault condition. If the high-power amplifier is over-heated and/or a fault condition has arisen, then at 240 the DC blanking control is configured to deactivate the high-power amplifier until the high-power amplifier is sufficiently cooled and/or the fault condition has been resolved. When the high-power amplifier is cooled and/or the fault condition has been resolved, the DC blanking control activates at 245 the high-power amplifier so the high-power amplifier can receive the RF signal from the medium power amplifier.

A person of ordinary skill in the art will readily appreciate that the temperature controller and the power out monitor can be configured to determine whether the high-power amplifier is over-heated and/or a fault condition has arisen when the low and medium-power amplifiers are amplifying the signal. Similarly, the DC blanking control can deactivate the high-power amplifier or any other amplifier when the high-power amplifier is over-heated and/or a fault condition arises.

If the high-power amplifier is not over-heated and/or a fault condition has not arisen, then the high-power amplifier receives at 250 the amplified RF signal from the medium-power amplifier and further amplifies and outputs at 255 the RF signal. For example, if the high-power amplifier has a gain of approximately 8 dB, then the power amplifier can amplify the received RF signal by approximately 8 dB. As a result, the output RF signal can be utilized for the spacecraft's navigation, radar, and communication functions.

When, for example, the radar, communication, and/or navigation functions are complete, then at 260, the module is deactivated in sequential order. For example, the RF input is deactivated; the voltage sequencer stops applying the positive drain voltages to the low-power, the medium-power amplifier, and the high-power amplifier; and the voltage sequencer stops applying the negative gate voltages to the low-power amplifier, the medium-power amplifier, and the high-power amplifier.

The method steps performed in FIG. 2 may be performed by a computer program, encoding instructions for the nonlinear adaptive processor to perform at least the method described in FIG. 2, in accordance with an embodiment of the present invention. The computer program may be embodied on a computer readable medium. A computer readable medium may be, but is not limited to, a hard disk drive, a flash device, a random access memory, a tape, or any other such medium used to store data. The computer program may include encoded instructions for controlling the nonlinear adaptive processor to implement the method described in FIG. 2, which may also be stored on the computer readable medium.

The computer program can be implemented in hardware, software, or a hybrid implementation. The computer program can be composed of modules that are in operative communication with one another, and which are designed to pass information or instructions to display. The computer program can be configured to operate on a general purpose computer, or an application specific integrated circuit ("ASIC") or a field programmable gate array (FPGA).

Figure 3:
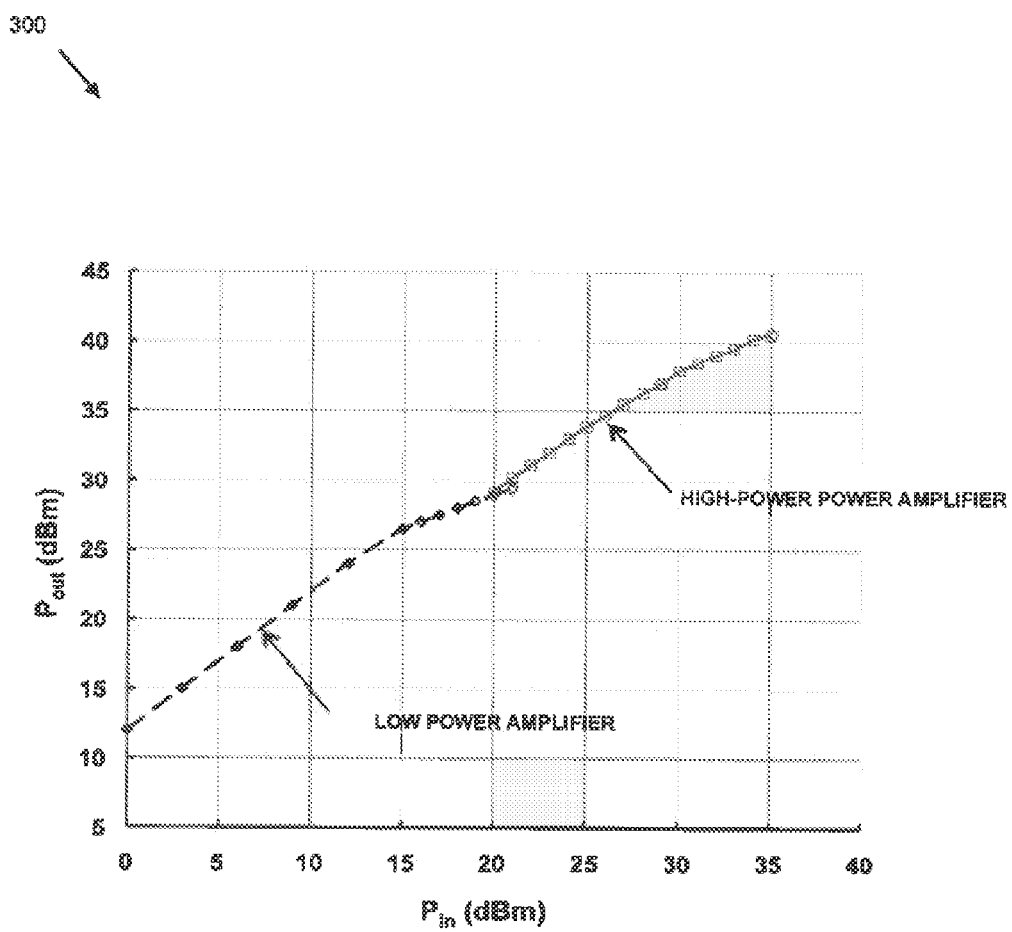
FIG. 3 illustrates a graph showing an output power versus an input power for an SSMPM, in accordance with another embodiment of the present invention.

FIG. 3 illustrates a graph 300 showing an output power versus an input power for a SSMPM, in accordance with another embodiment of the present invention. In particular, FIG. 3 illustrates a graph showing the output power versus the input power for the GaAs pHEMT low-power MMIC distributed amplifier and the GaN HEMT medium/high-power MMIC distributed amplifier.

For instance, FIG. 3 shows that a power input at 7.5 dBm for the low-power amplifier has a power output of 20 dBm, resulting in the medium-power amplifier receiving a power input of 20 dBm. The medium-power amplifier can then have a power output of 29 dBm, allowing the high-power amplifier to have a power input of 29 dBm. The power output of the high-power amplifier can then be at 37 dBm.

Figure 4:
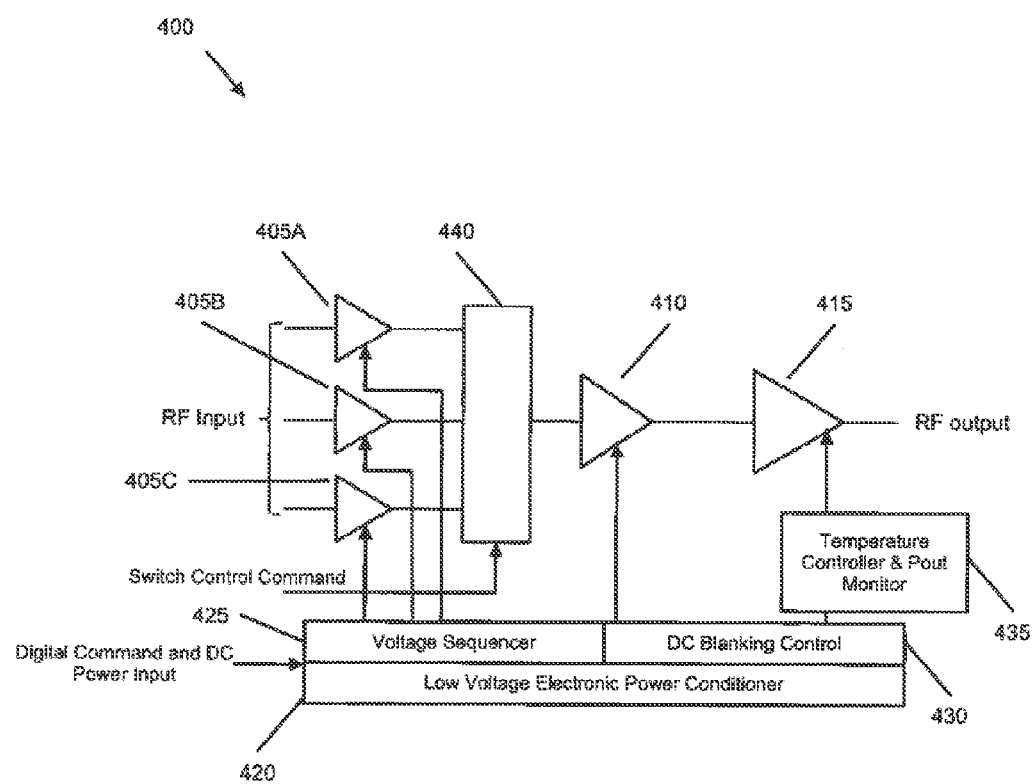
FIG. 4 illustrates a SSMPM with three narrow band amplifiers at the input, which are switched in and out of the circuit by a switch, in accordance with another embodiment of the present invention.

FIG. 4 illustrates a SSMPM 400 with three narrow band low-power and/or low noise amplifiers at the input, which are switched in and out of the circuit by a switch 440, in accordance with another embodiment of the present invention. In this embodiment, module 400 includes narrowband GaAs pHEMT low-power and/or low noise MMIC amplifiers 405A-C, a wideband GaN or GaAs pHEMT distributed medium-power MMIC amplifier 410, and a wideband GaN distributed high-power MMIC amplifier 415. It should be appreciated that while power amplifiers 405A-C are narrowband power amplifiers, a person of ordinary skill in the art will readily appreciate that wideband power amplifiers can be utilized as well.

Low-power amplifier 405A can be configured to receive a signal at S-band (for remote sensing), low-power amplifier 405B can be configured to receive a signal at X-band (for radar or communications), and low-power amplifier 405C can be configured to receive a signal at Ku-band, K-band, or Ka-band RFs (for communications or science experiments). This configuration allows module 400 to cover different frequency bands designated for radar, communications, and/or navigation, while using different narrow band low power and/or low noise amplifiers.

Module 400 also includes EPC 420, a voltage sequencer 425, a DC blanking control 430, and a RF output monitor 435. Module 400 also includes a switch 440. Switch 440 can be a vertical PIN monolithic single pole triple throw switch, and can switch between low-power amplifiers 405A-C as required. For instance, when a central processing unit commands/activates the RF input and switch 440 by transmitting a digital command/DC power input and a switch control command, a signal at S-band can be transmitted to low-power amplifier 405A to allow low-power amplifier 405A to amply the signal. The amplified signal is transmitted to medium-power amplifier 410 via switch 440. In this case, low-power amplifiers 405B, 405C are not activated and are not connected to the circuit by the switch 440, thereby preventing any noise from transmitting to medium-power amplifier 410. Similarly, when low-power amplifier 405B is amplifying, low power amplifiers 405A and 405C are not connected. Likewise, when 405C is amplifying, amplifiers 405A and 405B are not connected.

It should be appreciated that, depending on the band that is being used, voltage sequencer 425 is configured to activate the low-power amplifier related to the band while the other low-power amplifiers are not activated. For instance, if a signal at S-band is to be received from RF input, then voltage sequencer 425 is configured to activate lower power amplifier 405A while low-power amplifiers 405B, 405C remain deactivated. In this instance, at the same time, a command from a central processing unit is transmitted to switch 440 in order to connect to low-power amplifier 405A, low-power amplifiers 405B and 405C remain disconnected. As a result, power is saved.

Figure 5:
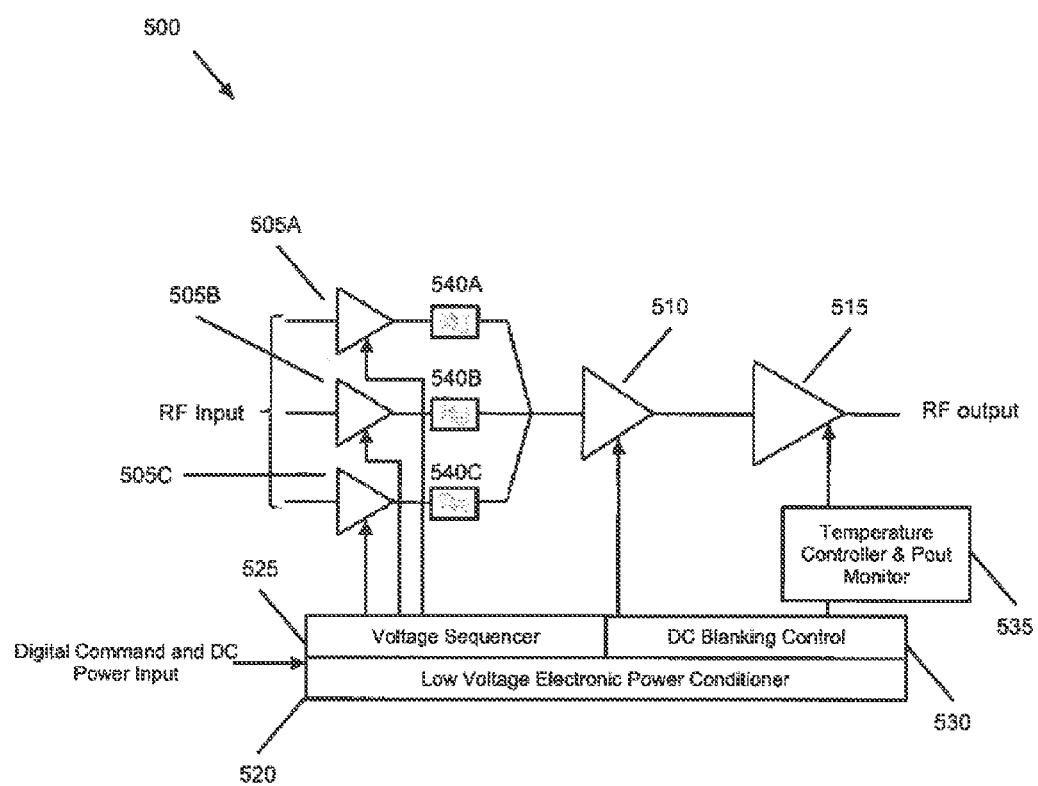
FIG. 5 illustrates a SSMPM with three band-pass filter circuits, in accordance with another embodiment of the present invention.

FIG. 5 illustrates a SSMPM 500 with three band-pass filter circuits, in accordance with another embodiment of the present invention. In particular, FIG. 5 is a variant of FIG. 4, such that the switch shown in FIG. 4 is replaced with band-pass filters 540A-C. Band-pass filter 540A is operatively connected to low-power amplifier 505A and medium-power amplifier 510. Band-pass filter 540B is operatively connected to low-power amplifier 505B and medium-power amplifier 510. Band-pass filter 540C is operatively connected to low-power amplifier 505C and medium-power amplifier 510. It should be appreciated that while power amplifiers 505A-C are narrowband GaAs pHEMT low-power MMIC power amplifiers, a person of ordinary skill in the art will readily appreciate that wideband power amplifiers can be utilized as well. Similarly, a person of ordinary skill in the art will readily appreciate that while medium-power amplifier 510 may be wideband GaN or GaAs pHEMT distributed MMIC amplifier and high-power amplifier 515 may be wideband GaN distributed MMIC amplifier. The medium-power amplifier 510 and high-power amplifier 515 can also be narrowband amplifiers.

Each band-pass filter 540A-C prevents cross talk between the three signal paths. For instance, if a signal at S-band is being received by low-power amplifier 505A, then band-pass filter 540A is configured to allow an amplified signal to transmit to medium-power amplifier 510, while band-pass filters 540B, 540C are configured to prevent noise from being transmitted to medium-power amplifier 510. Band-pass filters 540B, 540C also prevent the amplified signal from low-power amplifier 505A from entering low-power amplifiers 505B, 505C. In another example, if a signal at X-band is received by low-power amplifier 505B, then the amplified signal from amplifier 505B is transmitted to medium-power amplifier 510, via band-pass filter 540B, but is prevented from entering or interfering with amplifiers 505A and 505C by band-pass filters 540A, 540C. This configuration allows for the elimination of PIN diodes and switch control circuitry, as well as increases module's 500 reliability.

Figure 6:
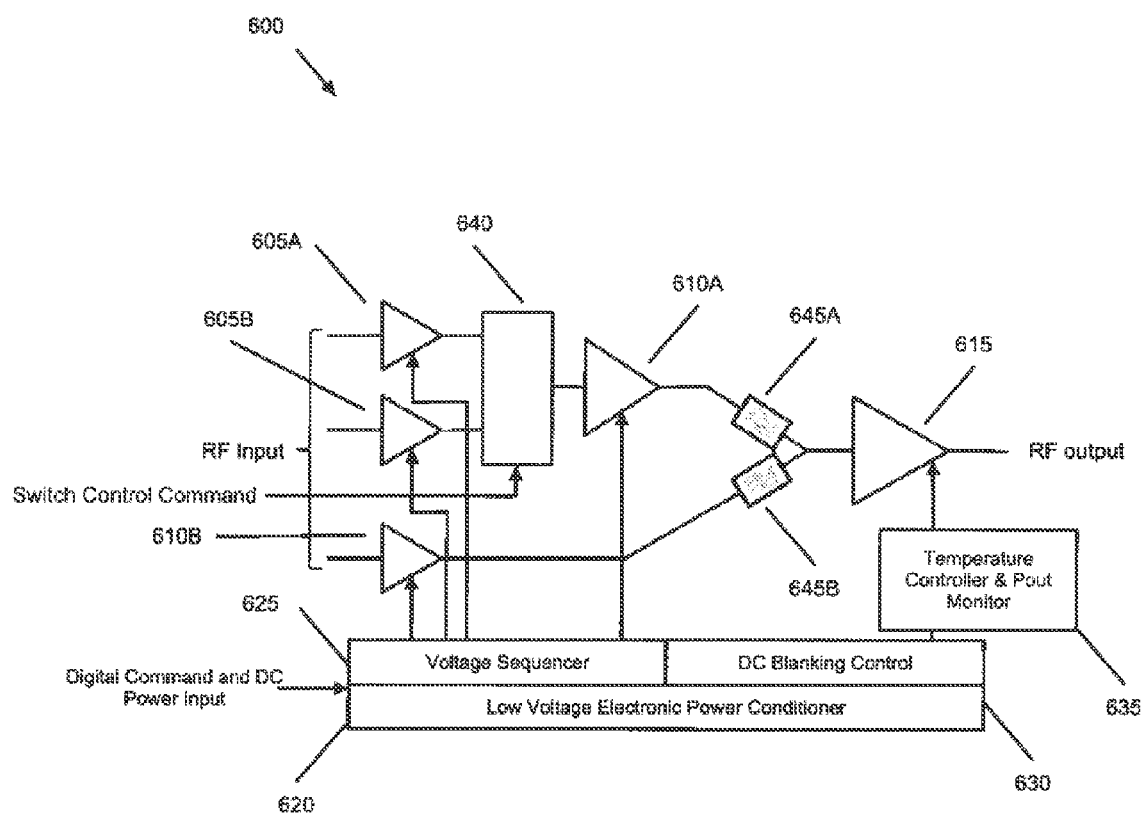
FIG. 6 illustrates a SSMPM with two narrow band amplifiers, in accordance with another embodiment of the present invention.

FIG. 6 illustrates a SSMPM 600 with two narrowband amplifiers, in accordance with another embodiment of the present invention. In this embodiment, two narrowband GaAs pHEMT low-power MMIC amplifiers 605A, 605B are operatively connected to a wideband medium-power amplifier 610A, via a switch 640. Low-power amplifier 605A is configured to receive a signal from RF input at S-band and low-power amplifier 605B is configured to receive a signal at X-band. Switch 640 is activated and/or instructed by a switch control command from a central processing unit and is configured to connect either low-power amplifier 605A or 605B based on the command. Wideband GaN or GaAs pHEMT distributed medium-power MMIC amplifier 610A is configured to transmit an amplified signal to wideband GaN distributed high-power MMIC amplifier 615 via band-pass filter 645A.

Also, medium-power amplifier 610B is configured to receive a signal at Ku-band, K-band, or Ka-band and is configured to transmit an amplified signal to high-power amplifier 615 via band-pass filter 645B. The power input of medium-power amplifier 610B can be in the range of 20 to 26 dBm, and the power output of medium-power amplifier 610B can be in the range of 29 to 35 dBm. As discussed above, band-pass filters 645A, 645B prevent cross talk between the two signal paths.

In other words, FIG. 6 shows two narrowband GaAs pHEMT low-power MMIC amplifiers 605A, 605B for navigation and radar at the inputs, which are switched into the circuit by switch 640. Switch 640 can be activated by a digital command received from the central processing unit at the time the RF input is activated. Typically, when navigation and radar functions are performed at S-band and X-band frequencies, amplifiers 605A, 605B are utilized, respectively. However, for communications, a K-band or Ka-band narrowband high-linearity GaAs pHEMT medium-power MMIC amplifier 610B is employed to directly drive high-power amplifier 615. Two band-pass filters 645A, 645B at the input of high-power amplifier 615 ensure that the cross talk between the two signal paths is kept to a minimum.

Figure 7:
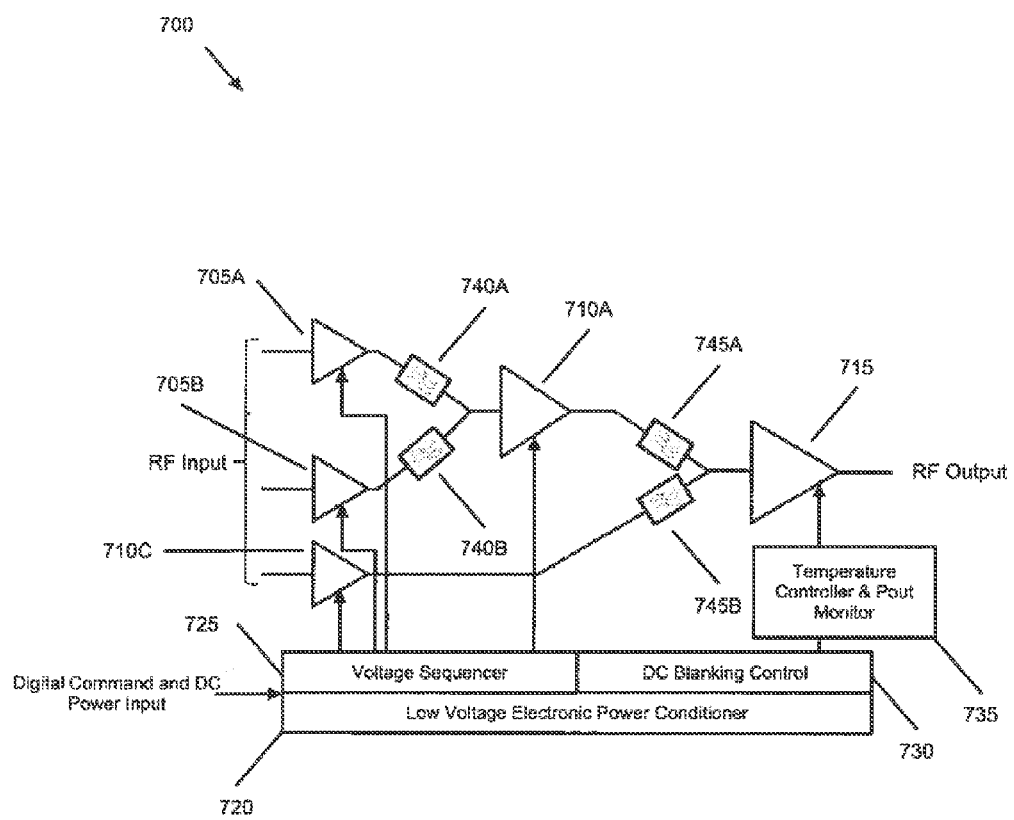
FIG. 7 illustrates a SSMPM with two band-pass filters, in accordance with another embodiment of the present invention.

FIG. 7 illustrates a SSMPM 700 with two band-pass filters, in accordance with another embodiment of the present invention. In particular, FIG. 7 is a variant of FIG. 6, such that the switch in FIG. 6 is replaced with two band-pass filters 740A, 740B to prevent cross talk between the two signal paths.

Figure 8:
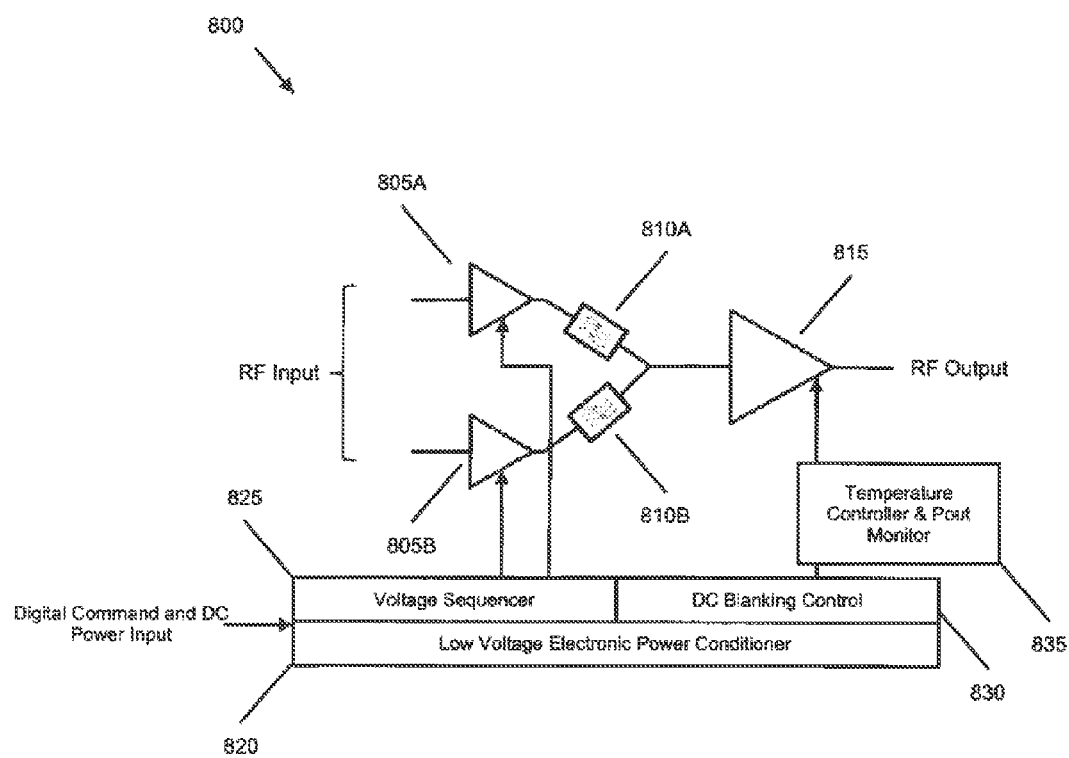
FIG. 8 illustrates a SSMPM with a multi-octave wide band medium amplifier and a narrow band high linearity medium-power amplifier, in accordance with another embodiment of the present invention.

FIG. 8 illustrates a SSMPM 800 with a multi-octave wide medium amplifier and a high linearity medium-power amplifier, in accordance with another embodiment of the present invention. In particular, FIG. 8 illustrates module 800 with either a GaN or silicon carbide (SiC) MMIC (multi-octave wide) distributed medium-power amplifier 805A and a narrowband GaAs pHEMT high-linearity medium-power amplifier 805B at the input. Medium-power amplifier 805A can receive signals at S-band, C-band and X-band and medium-power amplifier 805B can receive signals at Ku-band, K-band, or Ka-band. It should be noted that SiC can be a wide bandgap semiconductor that has excellent thermal properties and is radiation hard.

Module 800 also utilizes two band-pass filters 810A, 810B to prevent cross talk between the signal paths. Wideband GaN distributed high-power MMIC amplifier 815, EPC 820, voltage sequencer 825, DC blanking control 830, and RF output monitor 835 have similar functions to those described above with respect to FIG. 1.

A person of ordinary skill in the art will realize that the microwave power module being all-solid-state is small in size and lightweight. In addition, by substituting a transistor based high-power amplifier in the place of a traveling-wave tube amplifier (TWTA) in the output stage, the need for a kV class electronic power conditioner is eliminated, which further reduces the overall size and mass. GaN and SiC being wide bandgap semiconductors, devices constructed from these materials can operate at elevated temperatures and are also inherently radiation hard. GaN HEMTs typically operate at voltages as high as 30V, which is closer to the spacecraft bus voltage, and hence the design of the DC-to-DC converter in the EPC is simplified. HEMTs may have a much higher unity current gain cut-off frequency ($f_t$) and maximum frequency of oscillation ($f_{max}$) than MESFETs. Distributed amplifiers inherently have very large gain-bandwidth product. The decade wide bandwidth of the distributed amplifier employed here translates into pulse rise times on the order of a few tens of picoseconds (ps), which are several orders of magnitude smaller than the nanosecond (ns) rise time required of the radar pulses. The module described in the embodiments above eliminates the need for three separate amplifiers for three different functions (communications, navigation and radar), and simplifies the payload design and enhances the reliability and lower the overall cost.

One having ordinary skill in the art will readily understand that the invention as discussed above may be practiced with steps in a different order, and/or with hardware elements in configurations that are different than those, which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. An apparatus, comprising:
a plurality of solid-state amplifiers configured to amplify a signal using a low power stage, a medium power stage, and a high power stage; and
a power conditioner configured to activate a voltage sequencer when power is received from a power source, wherein the voltage sequencer is configured to sequentially apply a constant voltage to a gate of each amplifier and sequentially apply a constant voltage to a drain of each amplifier; and
a radio frequency output monitor comprising a temperature controller and a power out monitor.

2. The apparatus of claim 1, wherein the low power stage comprises a low power amplifier configured to receive a signal from a radio frequency input and amplify the signal to a sufficient level to drive a medium power amplifier.

3. The apparatus of claim 1, wherein the low power stage comprises at least two low power amplifiers configured to receive a signal from a radio frequency input and amplify the signal to a sufficient level to drive a medium power amplifier.

4. The apparatus of claim 1, wherein the medium power stage comprises at least one medium power amplifier configured to receive a first amplified signal from at least one low power amplifier and amplify the first amplified signal into a second amplified signal sufficient to drive a high power amplifier.

5. The apparatus of claim 1, wherein the high power stage comprises a high power amplifier configured to receive a second amplified signal from a medium power amplifier and amplify the second amplified signal into a third amplified signal sufficient to allow at least one of radar, navigation or communication functions to be performed.

6. The apparatus of claim 3, further comprising:
a switch operatively connected between the at least two low power amplifiers and the medium power amplifier,
wherein the switch, based on a command from a processor, is configured to connect one of the at least two low power amplifiers to the medium power amplifier.

7. The apparatus of claim 3, further comprising:
a plurality of band-pass filters, each filter operatively connected between each low power amplifier and the medium power amplifier,
wherein each band-pass filter is configured to prevent the amplified signal from passing through the band-pass filter and into another low power amplifier.

8. The apparatus of claim 1, wherein
the temperature controller is configured to monitor a temperature of a high power amplifier,
when the temperature of the high power amplifier is at a excessively high, the temperature controller is configured to notify a DC blanking control to deactivate the high power amplifier, and
when the temperature of the high power amplifier is at a normal state, the temperature controller is configured to notify the DC blanking control to activate the high power amplifier.

9. The apparatus of claim 1, wherein
the power out monitor is configured to monitor an output power from a high power amplifier for a fault condition,
when the fault condition arises, the power out monitor is configured to notify a DC blanking control unit to deactivate the high power amplifier, and
when the fault condition is resolved, the power out monitor is configured to notify a DC blanking control unit to activate the high power amplifier.

10. An apparatus, comprising:
a low power amplifier configured to receive a signal from a radio frequency input and amplify the received signal into a second signal;
a medium power amplifier operatively connected to the low power amplifier and configured to receive the second signal and amplify the second signal into a third signal;

a high power amplifier operatively connected to the medium power amplifier and configured to receive the third signal and amplify the third signal to a level sufficient to perform navigation, radar, and communication functions; and a power conditioner configured to receive power from a power source and activate a voltage sequencer configured to sequentially apply a constant voltage to a gate of each amplifier and sequentially apply a constant voltage to a drain of each amplifier; and wherein the voltage sequencer is configured to sequentially apply negative power to a gate of each amplifier and then sequentially apply positive power to a drain of each amplifier.

11. An apparatus, comprising:

a low power amplifier configured to receive a signal from a radio frequency input and amplify the received signal into a second signal;

a medium power amplifier operatively connected to the low power amplifier and configured to receive the second signal and amplify the second signal into a third signal;

a high power amplifier operatively connected to the medium power amplifier and configured to receive the third signal and amplify the third signal to a level sufficient to perform navigation, radar, and communication functions; and a power conditioner configured to receive power from a power source and activate a voltage sequencer configured to sequentially apply a constant voltage to a gate of each amplifier and sequentially apply a constant voltage to a drain of each amplifier; and a blanking control configured to activate and deactivate the high power amplifier based on instructions received from a radio frequency output monitor.

12. The apparatus of claim 11, wherein the radio frequency output monitor is located proximate to or on the power amplifier, and the radio frequency output monitor comprises a temperature controller and a power out monitor.

13. The apparatus of claim 12, wherein the temperature controller is configured to monitor an over temperature condition, and when an over temperature condition arises, the temperature controller is configured to notify the blanking control to deactivate the high power amplifier.

14. The apparatus of claim 12, wherein the power out monitor is configured to monitor the output power of the high power amplifier, and when a fault condition arises, the power out monitor is configured to notify the blanking control to deactivate the high power amplifier.

15. The apparatus of claim 14, wherein the power out monitor is configured to monitor the output power of the high power amplifier and notify the voltage sequencer to adjust voltages being applied to the amplifiers in order for the power to remain constant.

16. An apparatus, comprising:

a plurality of low power amplifiers, each low power amplifier is configured to receive a signal from an radio frequency input and amplify the received signal into a first amplified signal;

a medium power amplifier configured to receive the first amplified signal and amplify the first amplified signal into a second amplified signal;

a high power amplifier configured to receive the second amplified signal and amplify the second amplified signal into a third amplified signal; and a power conditioner configured to receive power from a direct current input and cause a voltage sequencer to provide a negative constant voltage to a gate of each preamplifier, the medium power amplifier and the high power amplifier before providing a positive constant voltage to a drain of each preamplifier, the medium power amplifier and the high power amplifier.

17. The apparatus of claim 16, further comprising:

a switch located between the plurality of low power amplifiers and the medium power amplifier, wherein the switch is configured, based on a command received from a processor, to connect one of the plurality of low power amplifiers with the medium power amplifier.

18. The apparatus of claim 16, further comprising:

a plurality of band-pass filters, each band-pass filter operatively connected with one of the plurality of low power amplifiers and the medium power amplifier, wherein each band-pass filter is configured to prevent the first amplified signal amplified by one of the low power amplifiers from passing through the band-pass filter and into another low power amplifier.

* * * * *